United States Patent
Kondo

(10) Patent No.: US 10,622,412 B2
(45) Date of Patent: Apr. 14, 2020

(54) DISPLAY PANEL

(71) Applicant: JOLED INC., Tokyo (JP)

(72) Inventor: Yoshiaki Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/519,879

(22) PCT Filed: Oct. 5, 2015

(86) PCT No.: PCT/JP2015/005065
§ 371 (c)(1),
(2) Date: Apr. 18, 2017

(87) PCT Pub. No.: WO2016/063471
PCT Pub. Date: Apr. 28, 2016

(65) Prior Publication Data
US 2017/0243930 A1     Aug. 24, 2017

(30) Foreign Application Priority Data

Oct. 20, 2014   (JP) ................................. 2014-213524

(51) Int. Cl.
*H01L 27/32* (2006.01)
*H01L 51/50* (2006.01)
(Continued)

(52) U.S. Cl.
CPC .......... *H01L 27/3218* (2013.01); *G09F 9/302* (2013.01); *H01L 27/3246* (2013.01);
(Continued)

(58) Field of Classification Search
CPC combination set(s) only.
See application file for complete search history.

(56) References Cited

U.S. PATENT DOCUMENTS

| 2007/0132356 A1* | 6/2007 | Hashimoto | ......... H01L 27/3246 |
| | | | 313/292 |
| 2009/0115952 A1* | 5/2009 | Nakamura | ............. G02B 5/201 |
| | | | 349/143 |

(Continued)

FOREIGN PATENT DOCUMENTS

| JP | 2004-335197 | 11/2004 |
| JP | 2009-302514 | 12/2009 |

(Continued)

OTHER PUBLICATIONS

International Search Report issued in International Patent Application No. PCT/JP2015/005065, dated Dec. 15, 2015.

*Primary Examiner* — Fazli Erdem
(74) *Attorney, Agent, or Firm* — Greenblum & Bernstein, P.L.C.

(57) ABSTRACT

Provided is an organic EL display panel including pixels that are arranged in a matrix. Each of the pixels includes a plurality of unit pixels. Each of the pixels includes a red unit pixel and a blue unit pixel. The red unit pixel and the blue unit pixel are arranged side by side in a row direction. In pixels adjacent to each other in the row direction among the pixels, unit pixels are arranged in at least one of manners as follows: red unit pixels are adjacent to each other; and blue unit pixels are adjacent to each other.

12 Claims, 5 Drawing Sheets

(51) Int. Cl.
  *H01L 51/56* (2006.01)
  *G09F 9/302* (2006.01)
  *H01L 51/00* (2006.01)

(52) U.S. Cl.
  CPC .......... *H01L 51/0005* (2013.01); *H01L 51/56* (2013.01); *H01L 51/5012* (2013.01)

(56) References Cited

U.S. PATENT DOCUMENTS

| | | | |
|---|---|---|---|
| 2009/0309108 A1* | 12/2009 | Chang | H01L 27/3211 257/89 |
| 2010/0277677 A1 | 11/2010 | Nakamura et al. | |
| 2010/0311298 A1* | 12/2010 | Suzuki | B41J 2/155 445/24 |
| 2011/0042691 A1* | 2/2011 | Hayata | H01L 51/0005 257/88 |
| 2011/0300289 A1* | 12/2011 | Suzuki | H01L 51/0005 427/8 |
| 2012/0217518 A1* | 8/2012 | Abe | H01L 27/3246 257/88 |
| 2013/0248844 A1* | 9/2013 | Hiraoka | H01L 51/56 257/40 |
| 2013/0286496 A1 | 10/2013 | Nakamura et al. | |
| 2014/0008625 A1* | 1/2014 | Hiraoka | H01L 51/56 257/40 |
| 2015/0171327 A1* | 6/2015 | Matsushima | H01L 51/0005 257/40 |
| 2015/0179140 A1 | 6/2015 | Nakamura et al. | |
| 2016/0043150 A1* | 2/2016 | Wang | H01L 27/3246 257/40 |

FOREIGN PATENT DOCUMENTS

| | | |
|---|---|---|
| JP | 2011-071008 | 4/2011 |
| JP | 2011-096378 | 5/2011 |
| JP | 2011-103216 | 5/2011 |
| JP | 2012-190029 | 10/2012 |
| JP | 2013-187000 | 9/2013 |

* cited by examiner

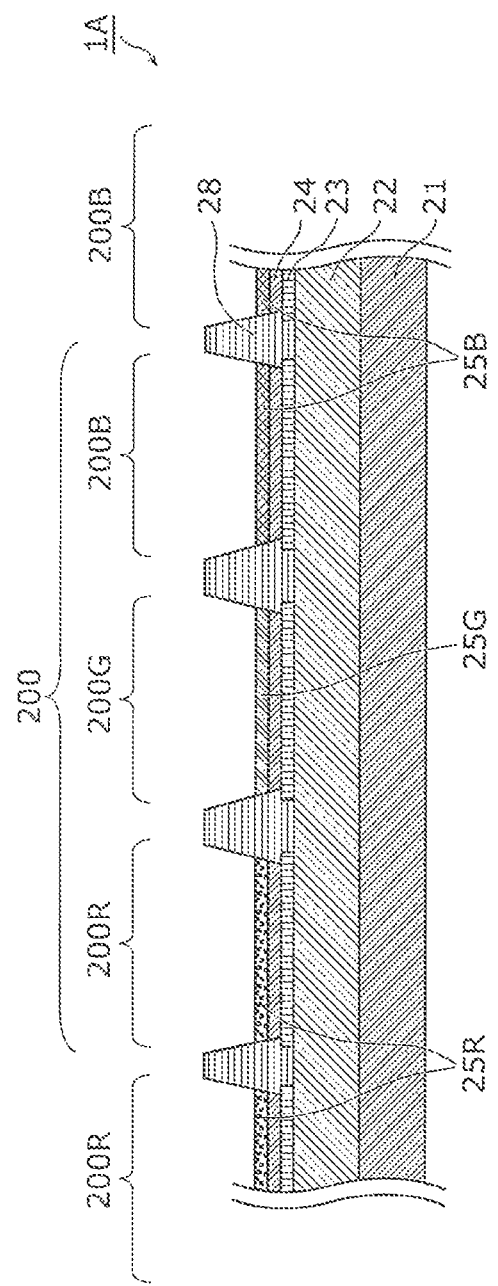

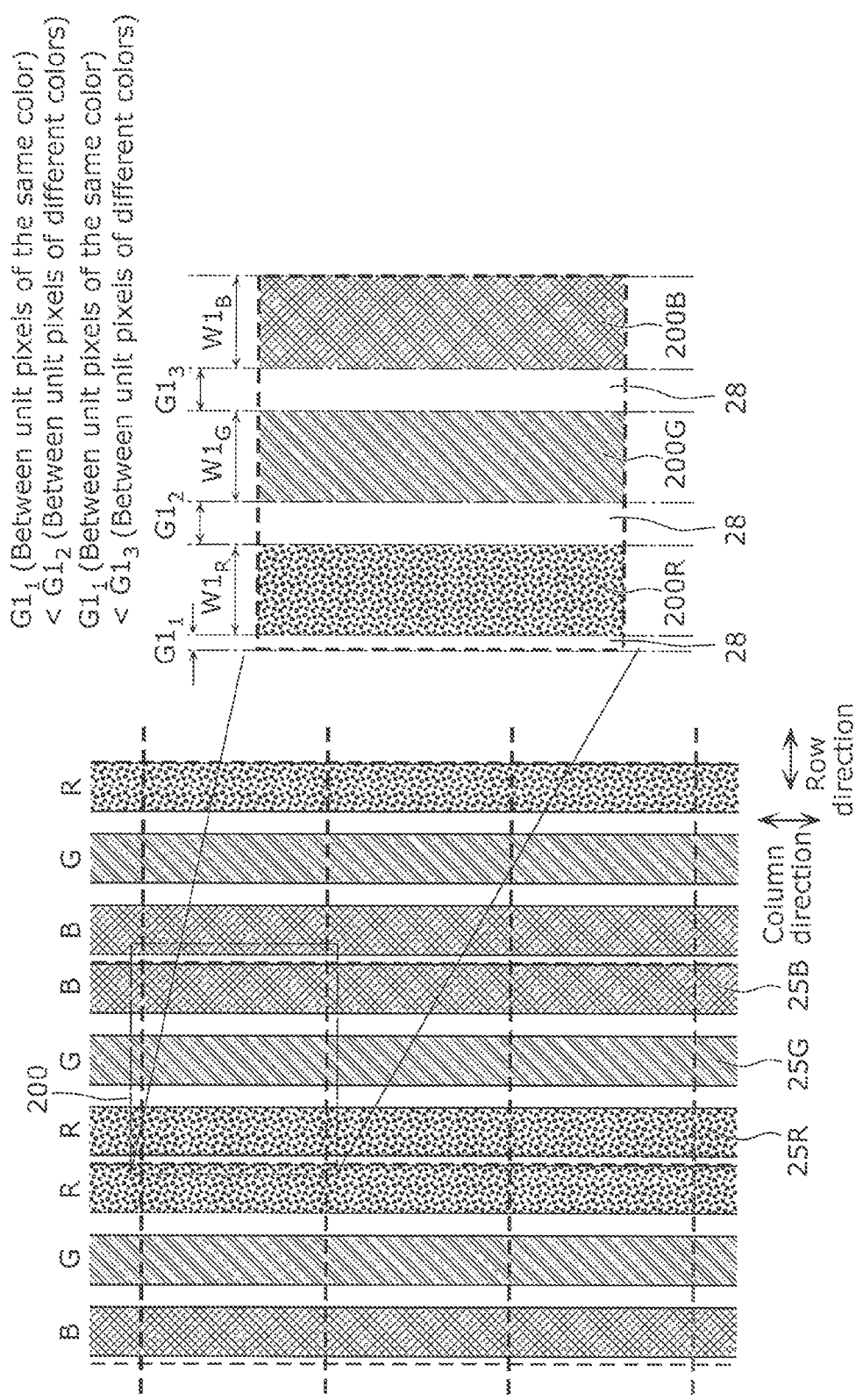

DISPLAY PANEL

TECHNICAL FIELD

The present disclosure relates to a display panel.

BACKGROUND ART

Display panels including organic electroluminescent elements (hereinafter referred to as organic EL elements) (hereinafter referred to as organic EL display panels) have recently been put into practical use as display panels capable of displaying clear images with low power consumption.

An organic EL display panel is a display panel in which pixels each including a plurality of organic EL elements are arranged in a matrix. Each of these organic EL elements includes an organic electronic material interposed between a pair of electrodes. Specifically, the organic EL element represents a color by utilizing the phenomenon of electroluminescence that occurs when holes and electrons are injected into a light-emitting layer made of the organic electronic material.

In the field of manufacturing such organic EL display panels, there has been developed a process of forming pixels by an inkjet method in which an ink containing an organic material is ejected in the form of a droplet.

Patent Literature 1 discloses a method for manufacturing organic EL elements. In this method, an ejection head having nozzles is moved over a panel substrate while a functional liquid containing a functional layer forming material is ejected in the form of a droplet onto the panel substrate and thereby a functional layer of an organic EL element is formed. Thus, a display panel having RGB elements arranged in a stripe, mosaic, or delta pattern can be formed stably.

CITATION LIST

Patent Literature

[PTL 1] Japanese Unexamined Patent Application Publication No. 2013-187000

SUMMARY OF INVENTION

Technical Problem

The method for forming an organic functional layer by an inkjet method as disclosed in Patent Literature 1, however, has the following disadvantages when respective colors corresponding to RGB unit pixels are applied for a multi-pixel and high-resolution display panel.

An ejection head must be moved with a smaller pitch for a display panel with more pixels and higher resolution. Therefore, if the ejection timing is slightly off, the ejected droplet of liquid is not deposited in a target unit pixel region but in the adjacent region, resulting in a defect of color mixture. In addition, in a display panel with more pixels and higher resolution, a droplet of liquid deposited in a unit pixel region spreads to the adjacent unit pixel region through a foreign matter contained in a bank (isolator) disposed between the adjacent unit pixel regions, resulting in a defect of color mixture.

The present invention has been made in view of the above problems, and it is an object of the present invention to provide a display panel with reduced mixture of colors of unit pixels.

Solution to Problem

In order to solve the above problems, a display panel according to one aspect of the present invention is a display panel including pixels that are arranged in a matrix, each of the pixels including a plurality of unit pixels. In this display panel, each of the pixels includes: a first unit pixel representing a color; and a second unit pixel representing a color different from the color of the first unit pixel. The first unit pixel and the second unit pixel are arranged side by side in a predetermined direction. In pixels adjacent to each other in the predetermined direction among the pixels, unit pixels are arranged in at least one of manners as follows: first unit pixels are adjacent to each other; and second unit pixels are adjacent to each other.

Advantageous Effects of Invention

In the display panel according to the present invention, unit pixels of the same color are adjacent to each other in pixels adjacent to each other in a predetermined direction, and thus mixture of colors can be reduced in the manufacturing process.

BRIEF DESCRIPTION OF DRAWINGS

FIG. 1B is a schematic cross-sectional view of an organic EL substrate according to the embodiment, FIG. 2 is a plan view showing arrangement of pixels in the organic EL display panel according to the embodiment.

DESCRIPTION OF EMBODIMENTS

Figure 1A:
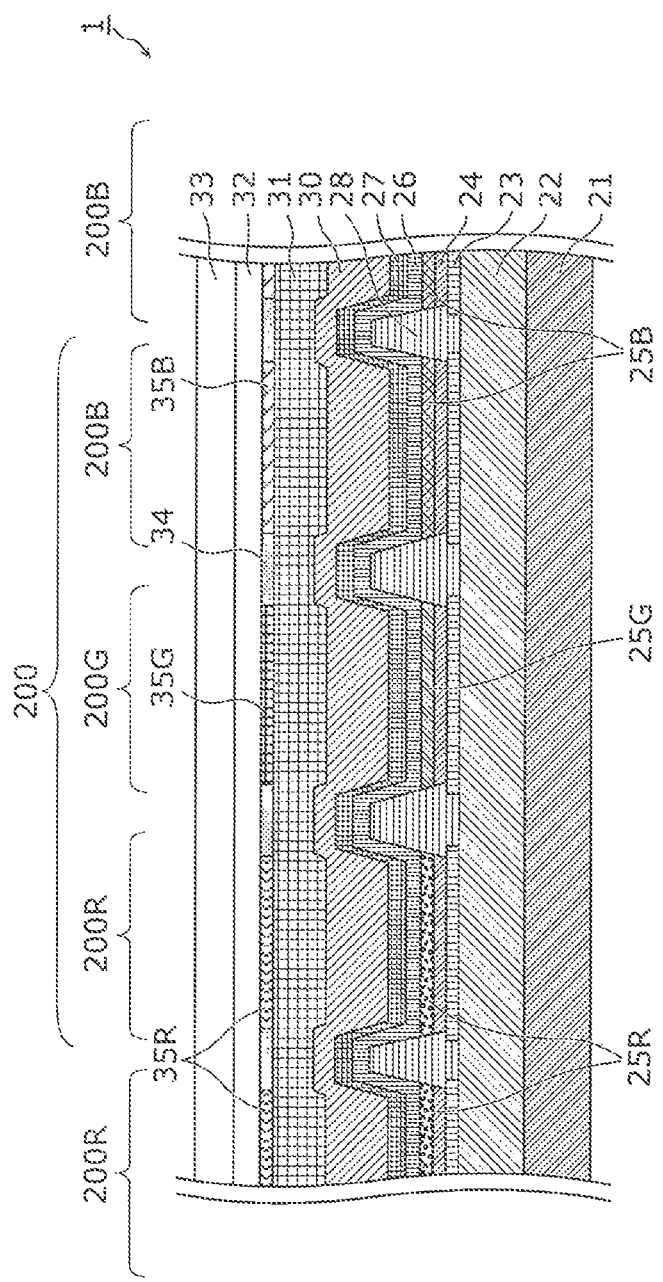
FIG. 1A is a schematic cross-sectional view of an organic EL display panel according to an embodiment.

An embodiment of a display panel will be described hereinafter with reference to the drawings. Note that the embodiment described below shows a preferred specific example of the present disclosure. The numerical values, shapes, materials, elements, the arrangement and connection of the elements, steps, the order of the steps, etc., indicated in the following embodiment are mere examples, and therefore are not intended to limit the present invention. Therefore, among the elements in the following embodiment, those not recited in any of the independent claims defining the most generic part of the inventive concept are described as optional elements.

Note that the drawings are merely schematic views and do not necessarily present accurate illustrations. In the drawings, structures that are substantially identical are given the same reference characters and description therefor is simplified or omitted to avoid redundancy.

Embodiment

[1. Configuration of Display Panel]

The configuration of an organic EL display panel 1 and that of an organic EL substrate 1A as a workpiece for the display panel 1 are described.

The organic EL display panel 1 and the organic EL substrate 1A are each a display panel including a plurality of pixels 200 arranged in a matrix. The plurality of pixels 200 each include a red unit pixel 200R representing red, a green unit pixel 200G representing green, and a blue unit pixel 200B representing blue.

FIG. 1A is a schematic cross-sectional view of an organic EL display panel according to an embodiment. The organic EL display panel 1 shown in FIG. 1A is an organic functional device including an anode, a cathode, and an organic light-emitting layer interposed between the anode and the cathode. The organic EL display panel includes pixels arranged in a matrix. In each of the pixels, a red unit pixel 200R, a green unit pixel 200G, and a blue unit pixel 200B, which are all sub-pixels, are arranged side by side. Each of the unit pixels includes, on a substrate 21, a planarizing film 22, an anode 23, a hole injection layer 24, an organic light-emitting layer (a red light-emitting layer 25R, a green light-emitting layer 25G, or a blue light-emitting layer 25B), a barrier 28, an electron injection layer 26, a cathode 27, a thin film sealing layer 30, a resin sealing layer 31, a color filter, an adhesive layer 32, and a transparent substrate 33. In FIG. 1A, color filters are provided in one-to-one correspondence to a red unit pixel 200R, a green unit pixel 200G, and a blue unit pixel 200B. Specifically, a red color filter 35R that preferentially transmits red light in the visible light region is provided over the red unit pixel 200R. A green color filter 35G that preferentially transmits green light in the visible light region is provided over the green unit pixel 200G. A blue color filter 35B that preferentially transmits blue light in the visible light region is provided over the blue unit pixel 200B. A black matrix 34 is provided to cover the spaces between the red color filters 35R, the green color filters 35G, and the blue color filters 35B.

Note that the color filter is not an essential component of the organic light-emitting layer and may not have to be provided when the organic light-emitting layer is made of a particular material.

The substrate 21 and the transparent substrate 33 are substrates for protecting the back surface and light-emitting surface of the organic EL display panel 1, and are, for example, transparent alkali-free glass plates with a thickness of 0.5 mm.

An example of the planarizing film 22 is made of an organic insulating material, and is formed on the substrate including, for example, a thin-film transistor (TFT) for driving.

The anode 23 is an anode supplied with holes, that is, an anode into which current flows from an external circuit, and has, for example, a structure including a reflective electrode made of aluminum, a silver alloy APC, or the like and stacked on the planarizing film 22. The thickness of the reflective electrode is 10 to 40 nm, for example.

The hole injection layer 24 is a layer containing a hole injecting material as a main component. The hole injecting material is a material having a function of injecting holes injected from the anode 23 side into the organic light-emitting layer stably or by supporting generation of holes.

The red light-emitting layer 25R, the green light-emitting layer 25G, and the blue light-emitting layer 256 are each an organic light-emitting layer that emits light when a voltage is applied between the anode 23 and the cathode 27, and are each made of an organic EL material. These organic light-emitting layers each have a stack structure of a lower α-NPD(Bis[N-(1-naphthyl)-N-phenyl]benzidine) layer and an upper Alq3(tris-(8-hydroxyquinoline)aluminum) layer.

The electron injection layer 26 is a layer containing an electron injecting material as a main component. The electron injecting material is a material having a function of injecting electrons injected from the cathode 27 into the organic light-emitting layer stably or by supporting generation of electrons.

The cathode 27 is a cathode supplied with electrons, that is, a cathode from which current flows toward an external circuit, and has a stack structure including a layer of ITO, which is a transparent metal oxide, for example. The thickness of the electrode is 10 to 40 nm, for example.

The barriers 28 are each an isolator for isolating sub-pixels in the pixel 200 from one another, and are each a bank formed of a photosensitive resin or a layer coated with a liquid-repellent material, for example.

The thin film sealing layer 30 is made of silicon nitride, for example, and has a function of shielding the organic light-emitting layer and the cathode 27 from moisture and oxygen. This is to prevent degradation (oxidation) of the organic light-emitting layer itself or the cathode 27 due to exposure to moisture and oxygen.

The resin sealing layer 31 is made of an acrylic or epoxy resin, and joins the color filter and an integrally-formed layer including layers from the planarizing film 22 to the thin film sealing layer 30 that are formed on the substrate described above.

The red color filter 35R, the green color filter 35G, and the blue color filter 35B as color filters for adjusting colors of red, green, and blue are provided beneath the transparent substrate 33 and the adhesive layer 32 so as to cover the light-emitting regions isolated by the barriers 28.

The above-described configuration including the anode 23, the organic light-emitting layer, and the cathode 27 is a basic configuration of the organic EL element. With this configuration, when an appropriate voltage is applied between the anode 23 and the cathode 27, holes are injected into the organic light-emitting layer from the anode 23 side and electrons are injected into the organic light-emitting layer from the cathode 27 side. The holes and electrons thus injected recombine in the organic light-emitting layer to generate energy, by which the light-emitting material of the organic light-emitting layer is excited to emit light.

Note that the materials for the hole injection layer 24 and the electron injection layer 26 are not limited in this embodiment, and well-known organic materials or inorganic materials may be used.

As another example of the configuration of the organic EL display panel 1, the organic EL display panel 1 may further include a hole transport layer between the hole injection layer 24 and the organic light-emitting layer, or an electron transport layer between the electron injection layer 26 and the organic light-emitting layer. The hole injection layer 24 may be replaced by the hole transport layer, and the electron injection layer 26 may be replaced by the electron transport layer. The hole transport layer is a layer containing a hole transporting material as a main component. The electron transport layer is a layer containing an electron transporting material as a main component.

FIG. 1B is a schematic cross-sectional view of the organic EL substrate according to the embodiment. The organic EL substrate 1A shown in FIG. 1B is a workpiece for the organic EL display panel 1. Specifically, as shown in FIG. 1B, the organic EL substrate 1A is a workpiece for the stack structure of the organic EL display panel 1, in which the electron injection layer 25 and the layers on and above the electron injection layer 26 are yet to be formed.

In the process of forming the organic light-emitting layers of the organic EL substrate 1A in the organic EL display panel 1 according to this embodiment, an inkjet printing method is used, for example. In other words, a droplet of liquid containing an organic EL material is ejected from a nozzle of an ejection head so that the droplet is deposited in a predetermined region on the organic EL substrate 1A, and thereby the organic light-emitting layer is formed. With this droplet ejection printing method, the film forming process is simplified compared with a thin film forming method, such as sputtering or vapor deposition, in which a target and a substrate are placed face to face in a high vacuum chamber to form a thin film. In addition, the material loss can be reduced and the surface area can be increased, resulting in an increase in productivity.

In forming the organic light-emitting layer using the above-described printing method, an ejection head of a printer is moved over a panel substrate so as to deposit a droplet of liquid containing an organic EL material representing a predetermined color in a target unit pixel region defined by the barrier 28. Specifically, for example, the printer is moved over the panel substrate so that droplets of liquid containing an organic material representing red are deposited sequentially in regions for red unit pixels 200R from one to the next. Next, the printer is moved over the panel substrate so that droplets of liquid containing an organic material representing green are sequentially deposited in regions for green unit pixels 200G from one to the next. Finally, the printer is moved over the panel substrate so that droplets of liquid containing an organic material representing blue are sequentially deposited in regions for blue unit pixels 200E from one to the next. Thus, the organic EL substrate 1A is formed in which the red light-emitting layers 25R, the green light-emitting layers 25G, and the blue light-emitting layers 255 are arranged in a predetermined pattern. Note that the order of forming the respective color unit pixels is not limited to the above-mentioned order.

Here, in the organic EL display panel 1 and the organic EL substrate 1A according to this embodiment, a red unit pixel 200R, a green unit pixel 200G, and a blue unit pixel 200E are arranged side by side in a predetermined direction. In addition, as shown in FIG. 1A and FIG. 1B, in the pixels 200 adjacent to each other in the predetermined direction, red unit pixels 200R are arranged adjacent to each other and blue unit pixels 2005 are arranged adjacent to each other. Here, droplets of liquid containing the same organic EL material are deposited in unit pixel regions representing the same color.

Thus, when a droplet of liquid ejected from the ejection head is not deposited in a target unit pixel region but deposited in the adjacent unit pixel region in the process of forming the organic light-emitting layer, or even when a droplet of liquid deposited in a unit pixel region spreads to the adjacent pixel region through a foreign matter in the barrier 28, unit pixels of the same color are likely to be adjacent to each other, and thus mixture of colors can be reduced.

[2. Arrangement of Pixels in Display Panel]

FIG. 2 is a plan view showing arrangement of pixels in the organic EL display panel according to the embodiment. FIG. 2 shows the layout of unit pixels arranged in the organic EL display panel 1.

As shown in the right part of FIG. 2, the pixels 200 each include a red unit pixel 200R, a green unit pixel 200G, and a blue unit pixel 2008. In this embodiment, the red unit pixel 200R is a first unit pixel representing red (a first color). The blue unit pixel 2006 is a second unit pixel representing blue (a second color) that is different from the color of the red unit pixel 200R. The green unit pixel 200G is a third unit pixel representing green (a third color) that is different from red and blue.

As shown in FIG. 2, the red unit pixel 200R, the green unit pixel 200G, and the blue unit pixel 2006 are arranged side by side in a row direction that is the predetermined direction. Here, in two pixels 200 adjacent to each other in the row direction, red unit pixels 200R are arranged adjacent to each other and blue unit pixels 2008 are arranged adjacent to each other.

Thus, when a droplet of liquid ejected from the ejection head is not deposited in a target unit pixel region but deposited in the adjacent unit pixel region in the process of forming the organic light-emitting layer, or even when a droplet of liquid deposited in a unit pixel region spreads to the adjacent unit pixel region through a foreign matter in the barrier 28, unit pixels of the same color are likely to be adjacent to each other, and thus mixture of colors can be reduced.

As shown in the right part of FIG. 2, a distance $G1_1$ between two unit pixels arranged adjacent to each other in the raw direction and representing the same color is smaller than a distance $G1_2$ or $G1_3$ between two unit pixels arranged adjacent to each other in the raw direction and representing different colors.

In this pixel arrangement, two unit pixels representing different colors can be arranged adjacent to each other in the raw direction with a larger distance than in the pixel arrangement in which a red unit pixel 200R, a green unit pixel 200G, and a blue unit pixel 2006 are arranged at equal distances in the raw direction, if the pixels and unit pixels in the former arrangement have the same areas as those in the latter arrangement. Thus, even if a droplet of liquid ejected from an ejection head is not deposited in a target unit pixel region or the barrier 28 contains a foreign matter, mixture of colors between different color unit pixels can be reduced.

Note that the distance $G1_2$ between a red unit pixel 200R and a green unit pixel 200G adjacent to each other in the row direction may be equal to or different from the distance $G1_3$ between a blue unit pixel 200B and a green unit pixel 200G adjacent to each other in the raw direction.

In addition, as shown in FIG. 2, in pixels 200 adjacent to each other in a column direction intersecting the row direction, red unit pixels 200R may be arranged adjacent to each other, blue unit pixels 200B may be arranged adjacent to each other, and green unit pixels 200G may be arranged adjacent to each other In other words, lines of red unit pixels 200R, lines of blue unit pixels 2006, and lines of green unit pixels 200G may be formed in the column direction.

With this arrangement, ejection of droplets can be performed on a per unit pixel column basis, not on a per unit pixel basis, in the process of forming the organic light-emitting layers. Thus, not only the control of ejection from an ejection head can be simplified but also mixture of colors can be reduced.

As shown in FIG. 1A, FIG. 1B, and FIG. 2, the organic EL display panel 1 may include barriers 28 between unit pixels adjacent to each other in the row direction to electrically isolate the adjacent unit pixels.

With this configuration, when droplets of liquid are ejected to form organic light-emitting layers, the ejected droplets can be deposited in the target unit pixel regions and thus spread of the droplets into other regions can be prevented. As a result, mixture of colors can be reduced.

Note that, as shown in FIG. 1A and FIG. 1B, the barrier 28 does not necessarily have to be a bank-like isolator formed between two adjacent unit pixels, but may be a layer formed by applying a liquid-repellent material to a space between the two adjacent pixels. This layer eliminates the need to form a solid structure as a barrier, and thus provides an advantageous configuration when the distance between unit pixels is smaller for more pixels and higher resolution.

Note that, in this embodiment, red unit pixels 200R are arranged adjacent to each other and blue unit pixels 200B are also arranged adjacent to each other in two pixels 200 adjacent to each other in the row direction, but the arrangement of unit pixels is not limited to this. In two pixels 200 adjacent to each other in the row direction, unit pixels may be arranged in at least one of manners as follows: red unit pixels 200R are adjacent to each other; and blue unit pixels 200B are adjacent to each other.

Instead of red unit pixels 200R and or blue unit pixels 200B, green unit pixels 200G may be arranged adjacent to each other in two pixels adjacent to each other in the row direction.

[3. Arrangement of Pixels in Display Panel in Comparative Example]

Figure 3A:
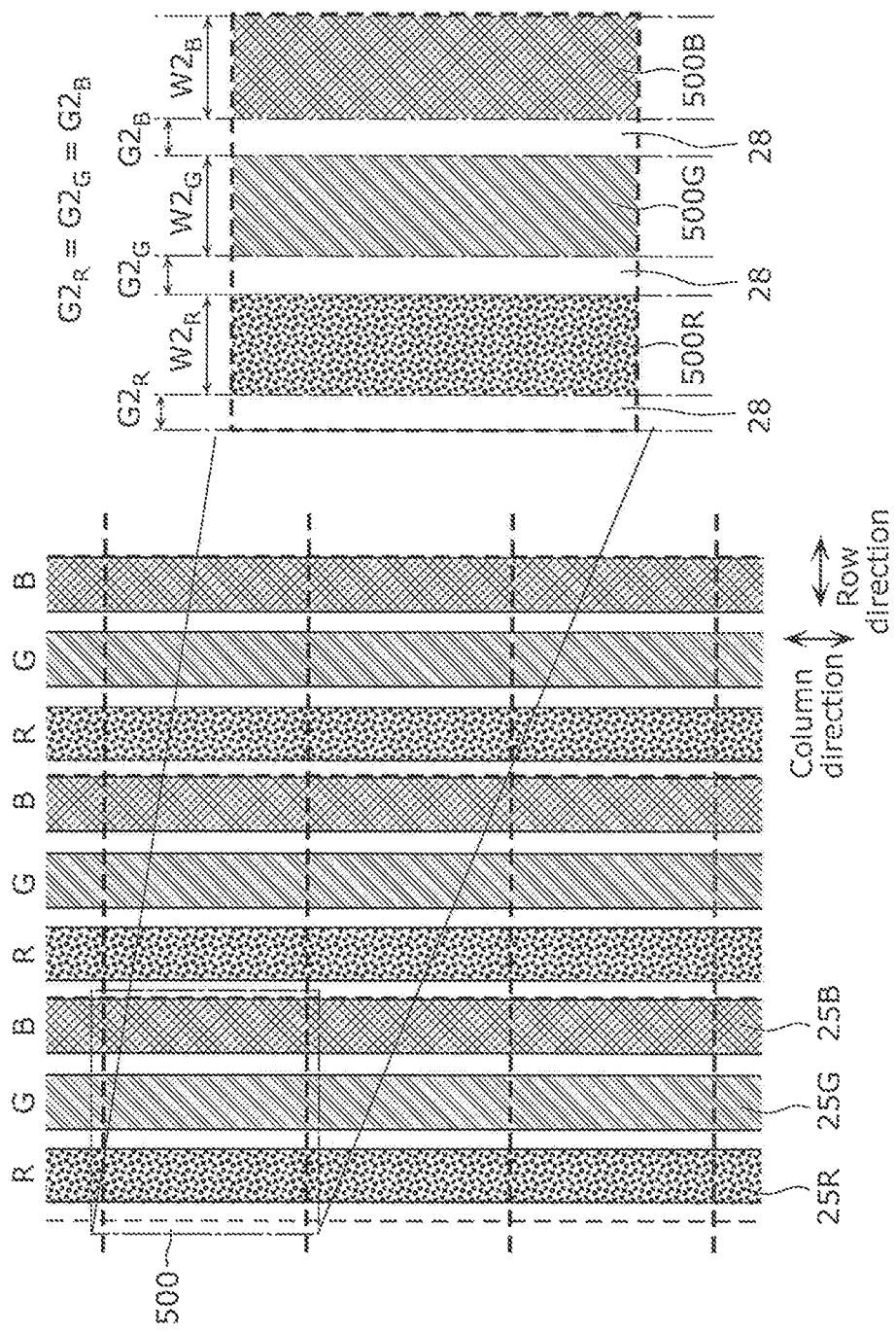
FIG. 3A is a plan view showing arrangement of pixels in a conventional display panel.

FIG. 3A is a plan view showing arrangement of pixels in a conventional display panel.

As shown in the right part of FIG. 3A, a pixel 500 includes a red unit pixel 500R, a green unit pixel 500G, and a blue unit pixel 500B. As shown in FIG. 3A, the red unit pixel 500R, the green unit pixel 500G, and the blue unit pixel 500E are arranged side by side in the raw direction that is the predetermined direction. Here, none of a red unit pixel 500R, a blue unit pixel 500B, and a green unit pixel 500G in a pixel 500 is adjacent to a red unit pixel 500R, a blue unit pixel 500B, and a green unit pixel 500G, respectively, in the adjacent pixel 500. In other words, two unit pixels adjacent to each other in the raw direction are unit pixels representing different colors.

As shown in the right part of FIG. 3A, the distances between two unit pixels adjacent to each other in the raw direction (i.e., a distance $G2_R$ between a blue unit pixel 500B and a red unit pixel 500R, a distance $G2_G$ between a red unit pixel 500R and a green unit pixel 500G, and a distance $G2_B$ between a green unit pixel 500G and a blue unit pixel 500B) are all equal.

Figure 3B:
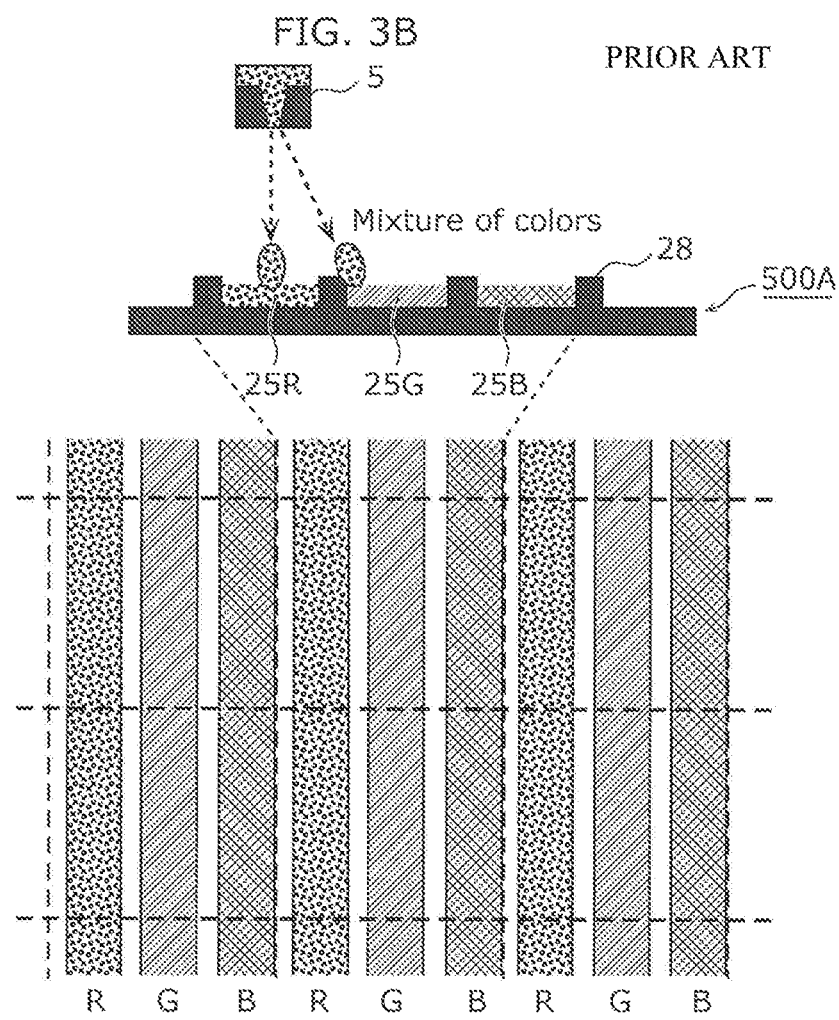
FIG. 3B is a diagram illustrating a defect of color mixture in the conventional display panel.

FIG. 3B is a diagram illustrating mixture of colors in a conventional display panel. To provide a display panel having a pixel arrangement as shown in FIG. 3A, a droplet of liquid of each color is ejected from an ejection head 5 by an inkjet method. Here, if the timing of ejection from the ejection head 5 is slightly off and the droplet is deposited in a unit pixel region adjacent to the target region, mixture of colors is likely to occur in two adjacent unit pixel regions, which should represent different colors. Likewise, in the case where a droplet of liquid spreads into a unit pixel region adjacent to the target region through a foreign matter contained in the barrier 28 disposed between the adjacent: unit pixels, mixture of colors is likely to occur. In addition, in a display panel with more pixels and higher resolution, mixture of colors as mentioned above is more likely to occur.

[4. Advantageous Effects, etc.]

As described above, a display panel according to one aspect of this embodiment is an organic EL display panel 1 including pixels 200 that are arranged in a matrix, each of the pixels 200 including a plurality of unit pixels. In this display panel 1, each of the pixels 200 includes: a red unit pixel 500R (a first unit pixel) representing color; and a blue unit pixel 500B (a second unit pixel) representing a color different from the color of the red unit pixel 500B. The red unit pixel 500R and the blue unit pixel 500B are arranged side by side in a row direction. In two pixels 200 adjacent to each other in the row direction among the pixels, unit pixels are arranged in at least one of manners as follows: red unit pixels 500R are adjacent to each other; and blue unit pixels 500B are adjacent to each other.

With this configuration, unit pixel regions of the same color are likely to be adjacent to each other. Therefore, in the process of forming an organic light-emitting layer, even when a droplet of liquid ejected from an ejection head is not deposited in a target unit pixel region but deposited in the adjacent unit pixel region or when a droplet of liquid spreads from a unit pixel region to the adjacent unit pixel region through a foreign matter in a barrier 28, mixture of colors can be reduced.

The distance between unit pixels arranged adjacent to each other in the raw direction and representing the same color may be smaller than that between unit pixels arranged adjacent to each other in the raw direction and representing different colors.

In this pixel arrangement, two unit pixels representing different colors can be arranged adjacent to each other in the raw direction with a larger distance than in the pixel arrangement in which a red unit pixel 200B, a green unit pixel 200G, and a blue unit pixel 200B are arranged at equal distances in the raw direction, if the pixels and unit pixels in the former arrangement have the same areas as those in the latter arrangement. Thus, even if a droplet of liquid ejected from an ejection head is not deposited in a target region or the barrier 28 contains a foreign matter, mixture of colors between different color unit pixels can be reduced.

In two pixels 200 adjacent to each other in a column direction intersecting to the raw direction on the surface of the display panel, red unit pixels 500B may be arranged adjacent to each other, and blue unit pixels 500B may be arranged adjacent to each other.

With this arrangement, droplet ejection can be performed on a per unit pixel column basis, not on a per unit pixel basis, in the process of forming the organic light-emitting layer. Thus, not only the control of ejection from an ejection head can be simplified but also mixture of colors can be reduced.

The organic EL display panel 1 may include barriers 28 between unit pixels adjacent to each other in the row direction to electrically isolate the adjacent unit pixels.

With this configuration, when droplets of liquid are ejected to form organic light-emitting layers, the ejected droplets can be deposited in the target unit pixel regions and thus spread of the droplets into other regions can be prevented. As a result, mixture of colors can be reduced.

A unit pixel includes, stacked above the substrate 21, an anode 23, a cathode 27, and an organic light-emitting layer formed of an organic EL material and interposed between the anode 23 and the cathode 27. This organic light-emitting layer may be formed by ejecting a droplet of liquid containing an organic EL material from a nozzle so that the droplet is deposited in a predetermined region on the substrate 21.

With this method, the film forming process is simplified compared with a thin film forming method, such as sputtering or vapor deposition, in which a target and a substrate are placed face to face in a high vacuum chamber to form a thin film. In addition, the material loss can be reduced and the surface area can be increased, resulting in an increase in productivity.

The first unit pixel represents a first color that is any one of red, blue, and green, and the second unit pixel represents a second color that is any one of red, blue, and green and is different from the first color. The pixel 200 may further include a third unit pixel representing a third color that is any one of red, blue, and green and is different from the first color and the second color.

With this configuration, an arrangement of three primary color (RGB) unit pixels, i.e., red unit pixels 200B representing red, blue unit pixels 200B representing blue, and green unit pixels 200G representing green can be provided. Thus, high-quality color images with reduced mixture of colors can be displayed.

Other Embodiments

Hereinbefore, the display panel has been described based on the illustrated embodiment, but the present invention is not limited to this embodiment. Other embodiments realized by arbitrarily combining structural components in the embodiment, embodiments arrived at by those skilled in the art by making various modifications to the embodiment within the scope of the present invention, and various devices having therein the display panel according to this embodiment are also included in the present invention.

For example, in the embodiment described above, each of the pixels 200 includes a red unit pixel 200R, a green unit pixel 200G, and a blue unit pixel 200B, but the colors of the unit pixels that form each pixel are not limited to red, blue, and green.

In addition, each of the pixels does not have to include three types of unit pixels representing three different colors (red, green, and blue), and may include two types of unit pixels representing two different colors or four or more types of unit pixels representing four or more different colors.

In the above embodiment, reduction of color mixture in the formation of organic light-emitting layers containing different organic EL materials representing different colors has been described, but the present invention can be applied to reduction of color mixture in the formation of color filters. The present invention can also be applied to the formation of a red color filter 35R, a green color filter 35G, and a blue color filter 35B by an inkjet printing method.

In the above embodiment, a red unit pixel 200R, a green unit pixel 200G, and a blue unit pixel 200B are arranged side by side in the row direction in the pixel 200, but these three types of unit pixels may be arranged in the column direction.

In the above embodiment, a configuration in which an anode is used as a lower electrode and a cathode is used as an upper electrode is shown, but a configuration in which a cathode is used as a lower electrode and an anode is used as an upper electrode is also possible. The components of each pixel, i.e., a planarizing layer, an anode, a hole injection layer, an organic light-emitting layer, a barrier, an electron injection layer, a cathode, and a thin film sealing layer, a resin sealing layer, a color filter, an adhesive layer, and a transparent substrate, are not limited to those shown in the above embodiment, and the materials, configurations, and formation methods for these components may be changed. For example, a hole transport layer may be provided between a hole injection layer and a light-emitting layer, or an electron transport layer may be provided between an electron injection layer and a light-emitting layer.

In the above embodiment, the organic EL display panel 1 having an organic light-emitting layer made of an organic EL material is described as an example, but the display panel 1 may have a light-emitting layer made of a material other than an organic EL material. For example, the display panel 1 may have a light-emitting layer made of an inorganic EL material.

Figure 4:
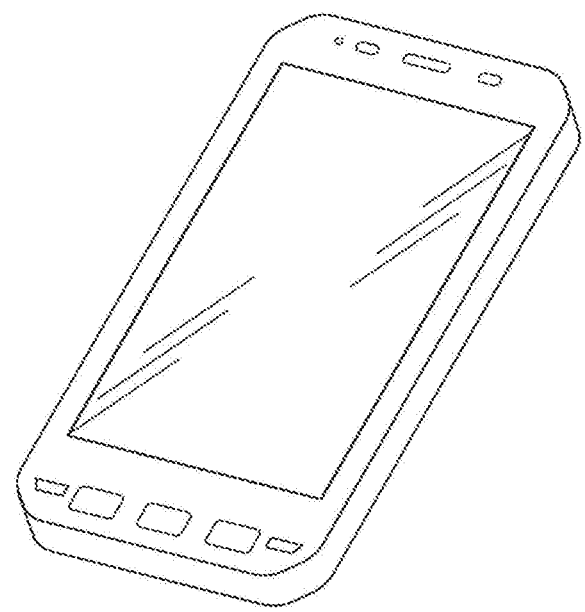
FIG. 4 is an external view of a mobile terminal having therein the organic EL display panel according to the embodiment.

The present invention is suitable for use in, for example, a thin mobile terminal including the organic EL display panel 1 according to this embodiment, as shown in FIG. 4.

INDUSTRIAL APPLICABILITY

The display panel according to the present invention can be used in technical applications such as displays for mobile terminals that require higher-definition and higher-resolution displays.

The invention claimed is:

1. A display panel comprising pixels that are arranged in a matrix, each of the pixels including a plurality of unit pixels,
wherein each of the pixels includes:
a first unit pixel representing a color; and
a second unit pixel representing a color different from the color of the first unit pixel,
the first unit pixel and the second unit pixel are arranged side by side in a first direction,
in pixels adjacent to each other in the first direction among the pixels, unit pixels are arranged as follows: first unit pixels are adjacent to each other; and second unit pixels are adjacent to each other,
each of the unit pixels includes, stacked above a substrate of the display panel, a planarizing film, an anode, a cathode, and an organic EL light-emitting layer made of an organic EL material and interposed between the anode and the cathode, the organic EL light-emitting layer being a printed film and being spaced from the planarizing film,
in pixels adjacent to each other in a second direction intersecting the first direction on a surface of the display panel, first unit pixels are arranged adjacent to each other and second unit pixels are arranged adjacent to each other, such that the light-emitting layers of the first unit pixels are connected in the second direction and the light-emitting layers of the second unit pixels are connected in the second direction,
the display panel further comprises a line isolator extending in the second direction, provided on and in contact with the planarizing film, the line isolator continuously provided in the second direction between the light-emitting layers of each of the unit pixels adjacent to each other in the first direction, the line isolator electrically and physically isolating the light-emitting layers of each of the adjacent unit pixels in the first direction, and
a width of the line isolator between the adjacent unit pixels having a same color is smaller than a width of the line isolator between the adjacent unit pixels having different colors.

2. The display panel according to claim 1,
wherein the first unit pixel represents a first color that is any one of red, blue, and green,
the second unit pixel represents a second color that is any one of red, blue, and green and is different from the first color, and
each of the pixels further includes a third unit pixel representing a third color that is any one of red, blue, and green and is different from the first color and the second color.

3. The display panel according to claim 1, wherein the planarizing film extends beneath the line isolator.

4. The display panel according to claim 1, wherein
in each of the unit pixels, the planarizing film is provided on and in contact with the substrate, and the anode, the organic EL light-emitting layer and the cathode are provided on the planarizing film in this order.

5. The display panel according to claim 2, wherein
the first unit pixels are adjacent to each other in the first direction and the second unit pixels are adjacent to each other in the first direction,
a width of the line isolator in the first direction provided between the adjacent first pixels is smaller than a width of the line isolator in the first direction provided between the first unit pixel and the third unit pixel; and
the width of the line isolator in the first direction provided between the adjacent first pixels is smaller than a width of the line isolator in the first direction provided between the second unit pixel and the third unit pixel.

6. The display panel according to claim 5, wherein the width of the line isolator in the first direction provided between the first unit pixel and the third unit pixel is different from the width of the line isolator in the first direction provided between the second unit pixel and the third unit pixel.

7. The display panel according to claim 1, wherein the line isolator comprises a layer of a liquid-repellent material provided between the adjacent unit pixels in the first direction.

8. The display panel according to claim 1, wherein the first direction is perpendicular to the second direction.

9. A display panel comprising pixels that are arranged in a matrix, each of the pixels including a plurality of unit pixels,
wherein each of the pixels includes:
a first unit pixel representing a color; and
a second unit pixel representing a color different from the color of the first unit pixel,
the first unit pixel and the second unit pixel are arranged side by side in a first direction,
in pixels adjacent to each other in the first direction among the pixels, unit pixels are arranged as follows: first unit pixels are adjacent to each other; and second unit pixels are adjacent to each other,
each of the unit pixels includes, stacked above a substrate of the display panel, a planarizing film, an anode, a cathode, and an organic EL light-emitting layer made of an organic EL material and interposed between the anode and the cathode, the organic EL light-emitting layer being a printed film and being spaced from the planarizing film,
in pixels adjacent to each other in a second direction intersecting the first direction on a surface of the display panel, first unit pixels are arranged adjacent to each other and second unit pixels are arranged adjacent to each other, such that the light-emitting layers of the first unit pixels are connected in the second direction and the light-emitting layers of the second unit pixels are connected in the second direction,
the display panel further comprises a line isolator extending in the second direction, provided on and in contact with the planarizing film, the line isolator continuously provided in the second direction between the light-emitting layers of each of the unit pixels adjacent to each other in the first direction, the line isolator electrically isolating each of the adjacent unit pixels in the first direction, and
a width of the line isolator between the adjacent unit pixels having a same color is smaller than a width of the line isolator between the adjacent unit pixels having different colors.

10. The display panel according to claim 9, wherein the line isolator comprises a portion that electrically and physically isolates the light-emitting layers of each of the adjacent unit pixels in the first direction.

11. The display panel according to claim 9, wherein the line isolator electrically and physically isolates, completely, the light-emitting layers of each of the adjacent unit pixels in the first direction.

12. The display panel according to claim 9, wherein the line isolator continuously provided in the second direction between the light-emitting layers of each of the unit pixels adjacent to each other in the first direction is a single line isolator.

* * * * *